United States Patent [19]

Stevie

[11] 4,296,197
[45] Oct. 20, 1981

[54] HALFTONE PRINTING SYSTEM

[75] Inventor: Robert W. Stevie, Ft. Thomas, Ky.

[73] Assignee: Innovative Photograhic Enterprises, Inc., Cincinnati, Ohio

[21] Appl. No.: 90,475

[22] Filed: Nov. 1, 1979

Related U.S. Application Data

[63] Continuation of Ser. No. 803,256, Jun. 3, 1977, abandoned.

[51] Int. Cl.³ .............................. G03F 5/00; G03C 5/00
[52] U.S. Cl. ........................................ 430/300; 355/70; 355/77; 430/394; 430/396; 430/494; 101/463.1
[58] Field of Search ............... 430/394, 395, 396, 494, 430/300; 355/67, 70, 77; 101/463.1

[56] References Cited

U.S. PATENT DOCUMENTS

| | | | |
|---|---|---|---|
| 3,129,099 | 4/1964 | Consaul | 355/77 |
| 3,179,519 | 4/1965 | Velten | 430/139 |
| 3,506,350 | 4/1970 | Denner | 355/40 |
| 3,597,077 | 8/1971 | Dorn | 355/71 |

OTHER PUBLICATIONS

Noemer, *Halftone Photography*, 1969, pp. 76 and 79.
Kosloff, *Screen Process Printing*, 1952, p. 179.
Cartwright, *Graphic Arts Manual*, vol. 2, "Photolithography," 1966, pp. 261-268, 283-291, 455-458, 212-213.

Primary Examiner—Edward C. Kimlin
Attorney, Agent, or Firm—Lane, Aitken, Ziems, Kice & Kananen

[57] ABSTRACT

In a halftone printing system, halftone positive prints are made directly from gray scale photographic negatives by an enlarger apparatus which shines a beam of light through the negative and focuses an image of the negative on a sheet of high contrast photographic printing paper through a halftone screen. A secondary light source is provided to irradiate the printing paper to provide satisfactory halftone representation of the gray scale. The positive halftone prints are assembled with cold type from which a negative is made. From the negative, a printing plate is then made.

5 Claims, 4 Drawing Figures

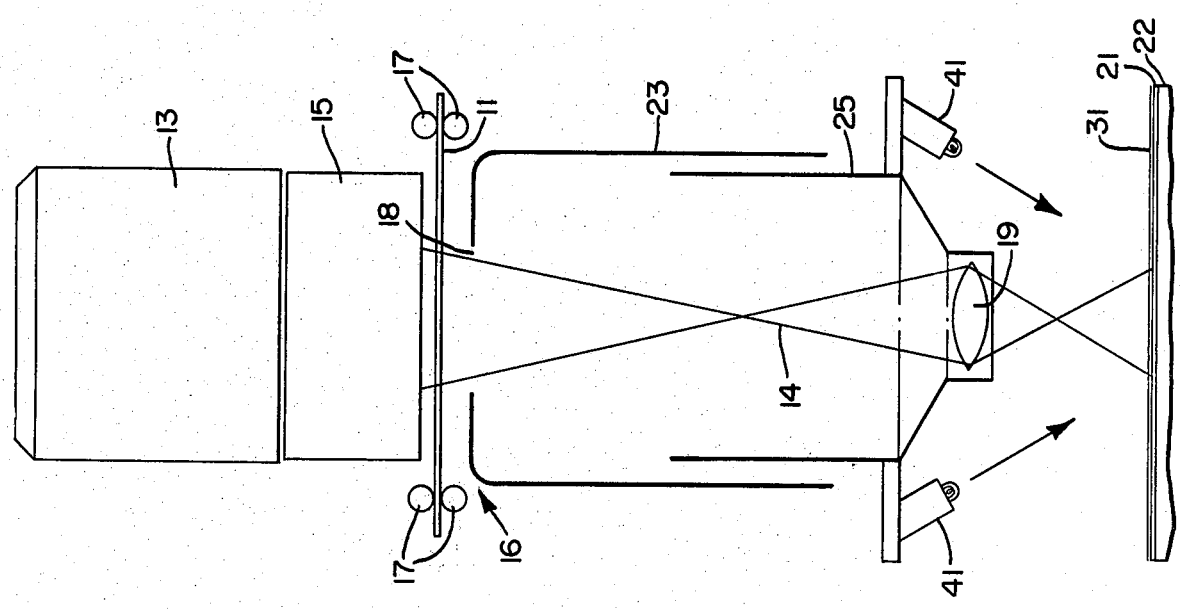
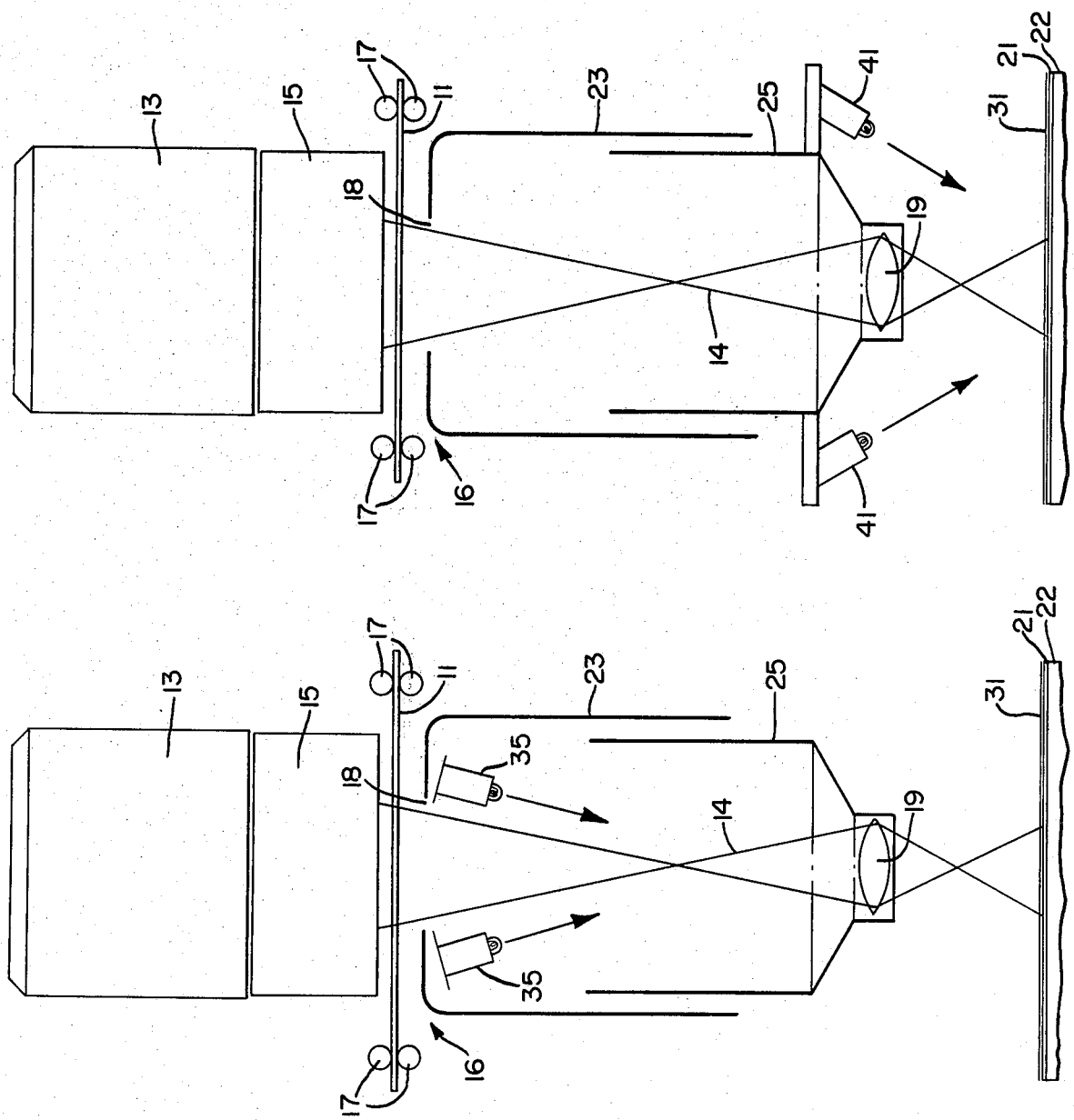

HALFTONE PRINTING SYSTEM

This is a continuation of application Ser. No. 803,256 filed June 3, 1977, now abandoned.

BACKGROUND OF THE INVENTION

This invention relates to an improved method of producing half-tones in printing and to apparatus used in the method.

In modern printing processes, such as letterpress printing or offset printing, it is not generally possible to directly print shades of gray such as would be seen in a photographic print. Accordingly, in order to produce shades of gray, to reproduce photographs, for example, different sizes of tiny black or dark dots are printed on a white or light background. This technique of printing shades of gray is referred to as printing halftones. In the technique presently used for producing halftones, first a halftone negative is made from the copy, such as a photograph, which is desired to be printed. The halftone negative is made by photographing the copy through a halftone screen, which causes the different shades of gray in the copy to be represented by different sizes of transparent dots on an opaque background.

In offset printing, this negative is then assembled with negatives of the type copy which is desired to print on the same page with the copy containing the shades of gray. The negatives of the type copy, referred to as line negatives, are first made by producing a copy of the type in the form of black letters on a white background such as could be produced, for example, by a typewriter. This copy of black letters on a white background is referred to as cold type. The cold type is cut up and then pasted down together on a carefully laid out sheet in the exact arrangement that the cold type is to be positioned on each page to be printed. In this assembly of cold type, which is referred to as a keyline layout or a mechanical, space is left in the appropriate positions for any halftone copy to be printed on the page. The line negative is then made from the keyline layout. The line negatives are then assembled with the halftone negatives by taping them down with transparent red tape on a sheet of opaque paper, in which the areas for the line negatives to appear and the halftone negatives to appear have been cut out. The assembly of the halftone negatives and the line negatives on the opaque paper is referred to as a flat. The flat is laid over a metal plate, the surface of which has been previously coated with a light sensitive emulsion, and the image from the flat is burned into the emulsion, which hardens under the transparent areas of the flat, rendering them insoluble to water. Nonprinting areas, which are shielded by the opaque parts of the flat, remain soluble. After exposure, the face of the metal plate is then coated with a special ink which adheres to the hardened portions of the emulsion to bring out the printing image but washes away from the nonprinting areas carrying the soluble emulsion with it leaving the metal exposed. The printing image then on the plate is then fixed and the plate is ready for the offset printing press.

SUMMARY OF THE INVENTION

The system of the present invention improves over the systems of the prior art in that it eliminates the necessity of separately taping together the halftone negatives with the line negatives. In accordance with the present invention, a halftone positive print is produced directly from a negative of the photograph which it is desired to reproduce. This halftone print is then assembled directly with cold type is the keyline layout and a single negative containing both the line negatives and the halftone negatives may be made from the keyline layout.

In accordance with the present invention, the photographic gray scale negative, from which a halftone positive print is to be made, is placed in an enlarger-type apparatus and printing paper is positioned under a halftone screen to have an image focused thereon of the negative in the enlarger apparatus. An auxiliary light source is provided preferably inside of the enlarger cone in order to achieve the proper dot size so as to correctly represent the different shades of gray in the resulting halftone positive print that is produced.

The apparatus described above operating on conventional printing paper will produce an unsatisfactory halftone positive print because the dots produced will not be black but will contain shades of gray and a satisfactory printed copy could not be produced from such a halftone print. In accordance with the present invention, this problem is overcome by using a high contrast positive printing paper instead of conventional paper. The high contrast paper when used with the apparatus described above makes excellent halftone positive prints, in which the dots are completely black throughout, produced on a clean white background.

BRIEF DESCRIPTION OF THE DRAWINGS

FIGS. 1-4 each are schematic illustrations in elevation of a different embodiment of the apparatus of the present invention which is used in making halftone positive prints in accordance with the method of the present invention.

DESCRIPTION OF THE PREFERRED EMBODIMENTS

Figure 1:
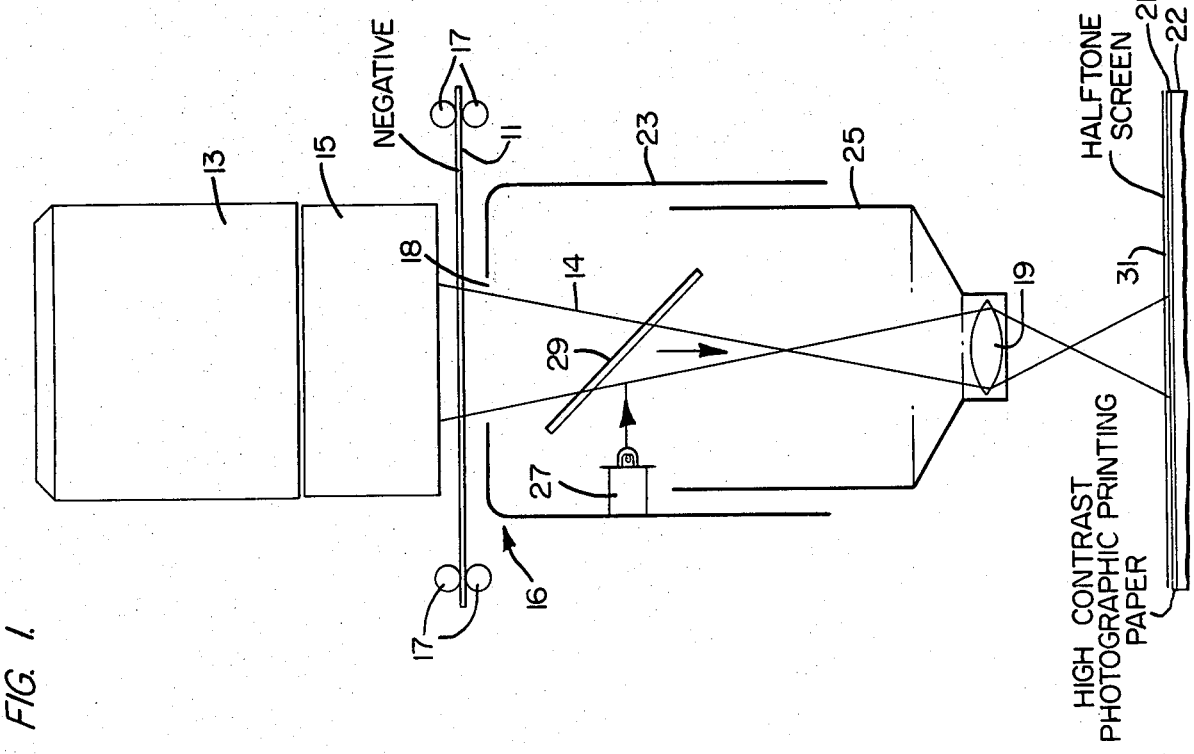

As shown in FIG. 1, reference number 11 designates a strip of photographic negative frames from which it is desired to print a corresponding halftone image. A light source is provided in a housing 13 and light from this source is shaped into a downwardly directed beam of light 14 by a condensor 15. The beam 14 passes through the negative frame in the strip 11 at the printing position into a lens cone 16. Rollers 17 are provided to advance the desired negative frame in the strip 11 to the printing position. The enlarger lens cone 16 defines an aperture 18 at the top thereof directly below the printing position to receive the beam of light 14 after it has passed through the negative frame at the printing position. The lens cone 16 has mounted in the lower end thereof a lens 19 arranged to receive the light beam 14 and to focus it into an image of the negative frame at the exposure position on a worktable 22. The worktable positions photographic printing paper 21 at the exposure position. The lens cone 16 is divided into an upper fixed portion 23 in which the aperture 18 is defined and lower portion 25, which carries the lens 19. By adjusting the lower portion 25, and thereby the lens 19, the size of the image focused on the printing paper can be adjusted. Alternatively, a variable focus length (zoom) lens may be used. A secondary light source 27 is mounted on the sidewall of the fixed portion 21 within the lens cone 16. Also mounted within the lens cone 16 is a half silvered light transmitting mirror 29, which is positioned at a 45 degree angle to reflect light from the source 27 to the lens 19 and also to transmit the beam of light 14 from the negative to the lens 19. The lens 19 directs the light from the secondary light source 27 onto the printing paper. Positioned over the positive printing paper 21 is a halftone screen 31.

When the desired film frame has been brought into the printing position and the source in the housing 13 is energized, an image of the film frame will be produced in halftones on the printing paper 21. Light from the secondary source 27, which is also energized, assures that the black dots of the halftones are produced in the sizes to correctly represent the various shades of gray. In order to achieve completely black dots rather than dots with varying shades of gray, it is necessary for the printing paper to be a high contrast paper having a contrast rating greater than Ilford No. 4. Ilford printing paper is numbered from 0 to 6 according to contrast with No. 6 being the highest contrast. Ilford No. 5 produces excellent black dots with no shades of gray. Nos. 5 and 6 are normally used only in art work. An alternative paper which may be used in Kodak Kodabrome Ultrahard. After the image has been formed on the printing paper for a length of time to produce the print with the desired darkness, the print is developed in the conventional manner and then is assembled into a page with cold type. Cold type, as explained above, is line type in which the letters are formed in black on a white background as would be produced by a conventional typewriter. The halftone print can simply be pasted into the appropriate space in the keyline layout of cold type. After one or more halftone prints have been pasted into position in the keyline layout, a negative is made of the entire keyline layout including the halftone print and then from this negative, an offset printing plate is made in the conventional manner. The system of the present invention thus eliminates the separate assembly of halftone negatives with the line type negative of the keyline layout required in the technique used in the prior art and a great saving in time and cost is achieved.

Figure 2:
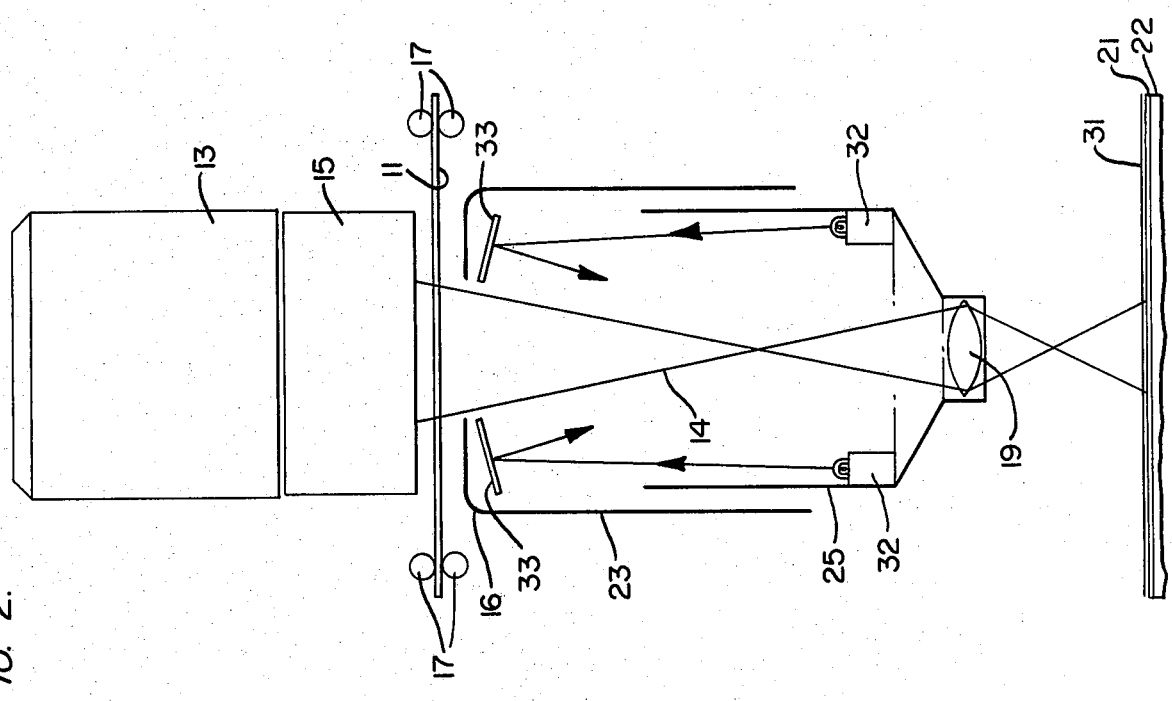

The alternative embodiments of FIGS. 2-4 are the same as that of FIG. 1 except that they employ different arrangements for the secondary light sources. The embodiment in FIG. 2 is just like that in FIG. 1 except that one or more secondary light sources 32 are mounted in the lower part of lens cone 16 near the bottom thereof on the movable portion thereof. Mirrors 33 are positioned on the opposite sides of the downwardly directed beam of light 14 in the lens cone near the top thereof. The mirrors 33 reflect the light from the secondary sources 32 to the lens 19 which projects the light from the secondary sources onto the positive printing paper.

In the embodiment of FIG. 3, one or more secondary sources 35 are mounted in the top of the lens cone on the fixed portion thereof on opposite sides of the beam of light 14 to radiate light directly to the lens 19, which then projects the light from the secondary sources on the printing paper. The light from the secondary sources 31 and 35 serves the same purpose in FIGS. 2 and 3 that it does in FIG. 1.

It is preferable for the secondary source or sources to be within the lens cone, but they may be outside the lens cone as shown in FIG. 4. In this embodiment, secondary light sources 41 are mounted outside the cone on a platform 43 fixed to the lower movable portion of the cone. Alternatively, the secondary light sources may be mounted independently of the lens cone. The light sources 41 radiate light directly onto the positive printing paper for the same purposes that the secondary sources are used in the embodiments of FIGS. 1-3.

The above described system greatly reduces the cost of printing monochromatic halftones by eliminating the need for separately assembling the halftone negative with negative line type copy. The above description is of preferred embodiments of the invention and modifications being made thereto without departing from the spirit and scope of the invention which is defined in the appended claims.

I claim:

1. A method of making a printing plate comprising focusing light into a gray scale image onto photographic printing paper through a halftone screen and irradiating said paper through said screen with light in addition to the light focused into said gray scale image, said printing paper being selected to have a sufficiently high contrast rating to produce dots which are uniformly black with no shades of gray over the area of each dot in the resulting halftone image produced on said printing paper, assembling said halftone print with cold type to make up a page, making a negative of the assembly of said cold type and said halftone print, and making a printing plate from said negative.

2. A method as recited in claim 1, wherein said gray scale image is provided by directing a light beam through a gray scale photographic negative, and focusing said light beam into an image of said negative onto said positive printing paper.

3. A method as recited in claim 2, wherein the image focused on said positive printing paper is an enlargement of the image represented by said negative.

4. A method as recited in claim 1, wherein the light focused into said gray scale image is provided by a first light source and the light irradiating said paper in addition to the light focused into said gray scale image is provided by a second light source.

5. A method as recited in claim 3, wherein the focusing of said gray scale image is carried out by a lens and wherein said light in addition to said light focused into said gray scale image is passed through said lens to irradiate said paper.

* * * * *